United States Patent
He et al.

[11] Patent Number: 6,153,470
[45] Date of Patent: Nov. 28, 2000

[54] FLOATING GATE ENGINEERING TO IMPROVE TUNNEL OXIDE RELIABILITY FOR FLASH MEMORY DEVICES

[75] Inventors: Yue-Song He, San Jose; Kent K. Chang, Cupertino; Jiahua Huang, San Jose, all of Calif.

[73] Assignee: Advanced Micro Devices, Inc., Santa Clara, Calif.

[21] Appl. No.: 09/374,059

[22] Filed: Aug. 12, 1999

[51] Int. Cl.[7] ..................... H01L 21/336; H01L 21/8234; H01L 31/072; H01L 29/04; H01L 29/72

[52] U.S. Cl. .......................... 438/257; 438/197; 438/923; 257/52; 257/64; 257/288

[58] Field of Search ..................... 438/211, 257, 438/197, 517, 518, 922, 923, 592, 593; 257/264, 282, 288, 756, 52, 64

[56] References Cited

U.S. PATENT DOCUMENTS

| | | | |
|---|---|---|---|
| 4,329,706 | 5/1982 | Crowder et al. | 357/71 |
| 4,354,309 | 10/1982 | Gardiner et al. | 29/571 |
| 4,829,024 | 5/1989 | Klein et al. | 437/189 |
| 5,093,700 | 3/1992 | Sakata | 357/23.1 |
| 5,298,447 | 3/1994 | Hong | 437/43 |
| 5,350,698 | 9/1994 | Huang et al. | 437/26 |
| 5,393,687 | 2/1995 | Liang | 437/46 |
| 5,481,128 | 1/1996 | Hong | 257/320 |
| 5,597,745 | 1/1997 | Byun et al. | 437/41 |
| 5,710,454 | 1/1998 | Wu | 257/413 |
| 5,877,980 | 3/1999 | Mang et al. | 365/185.17 |
| 5,977,601 | 1/1999 | Yang et al. | 257/437 |

*Primary Examiner*—Matthew Smith
*Assistant Examiner*—Lex H. Malsawma
*Attorney, Agent, or Firm*—Skjerven Morrill MacPherson LLP; Edward C. Kwok

[57] ABSTRACT

A method of forming floating gate to improve tunnel oxide reliability for flash memory devices. A substrate having a source, drain, and channel regions is provided. A tunnel oxide layer is formed over the substrate. A floating gate is formed over the tunnel oxide and the channel region, the floating gate being multi-layered and having a second layer sandwiched between a first layer and a third layer. The first layer of the floating gate overlying the tunnel oxide layer includes an undoped or lightly doped material. The second layer is highly-doped. The third layer is in direct contact with a dielectric layer, e.g., an oxide-nitride-oxide stack, and is made of an undoped or lightly doped material. A dielectric material is formed over the floating gate and a control gate is formed over the dielectric material.

21 Claims, 2 Drawing Sheets

FLOATING GATE ENGINEERING TO IMPROVE TUNNEL OXIDE RELIABILITY FOR FLASH MEMORY DEVICES

BACKGROUND OF THE INVENTION

1. Field of the Invention

The present invention relates to memory cells and methods for manufacture thereof, and more specifically, to a method for manufacturing a floating gate with improved tunnel oxide reliability.

2. Discussion of the Related Art

Nonvolatile memory devices such as electrically programmable read-only memory (EPROM) and electrically-erasable programmable read-only memory (EEPROMs) are extensively used. An EPROM or EEPROM integrating circuit has a large number of memory cells each having an electrically isolated gate, referred to as a floating gate. Data is stored in the memory cells in the form of charge on the floating gates. Charge is transported to or removed from the floating gates by program and erase operations, respectively.

Another type of non-volatile memory is flash memory which is a derivative of EPROM and EEPROM. However, flash memory has a distinct advantage over EPROM in that certain types of flash memory can be erased and reprogrammed inside a system, with no special voltages needed. Flash memory devices are also lower in cost and available in higher densities than EEPROM. As a result, flash memory is well-suited to a number of end-product applications, including existing embedded-system flash applications as personal computers and peripherals, telecommunication switches, cellular phones, and internetworking, instrumentation and automotive devices, and emerging consumer-oriented voice, image and data storage products such as digital still cameras, digital voice recorders, and personal digital assistants (PDAs).

Flash memory can be erased and reprogrammed in units of memory called blocks. The erasure is caused by Fowler-Nordheim tunneling in which electrons pierce through a thin dielectric material to remove an electronic charge from a floating gate associated with each memory cell.

FIG. 1 shows a cross-sectional view of a portion of the memory cell in a typical NAND-type flash memory. Memory cell 10 typically includes a source region 16, a drain region 18 and a channel region 14 in a substrate 12, and a stacked gate structure 20 overlying the channel region 14 and separated by a dielectric layer 22. Source region 16 and drain region 18 are constructed from an N+ type of high impurity concentration and are separated by a predetermined space of a channel region 14 which is of P-type. Substrate 12 is an N-type substrate.

Stacked gate structure 20 typically includes a floating gate 24 formed by a first polysilicon (poly I) layer and a control gate 28 formed by a second polysilicon (poly II) layer. Floating gate 24 is isolated from control gate 28 by an interpoly dielectric layer 26 and from channel region 14 by a thin oxide layer 22 which is approximately 100 Å (angstroms) thick. The thin oxide layer 22 is commonly referred to as the tunnel oxide. Interpoly dielectric layer 26 is often a multilayer insulator such as an oxide-nitride-oxide (ONO) stack.

Because polysilicon has interleaving large and small grain structures, polysilicon has many grain boundaries, thereby causing rough surface interface between floating gate 24 and tunnel oxide 22 and between floating gate 24 and interpoly dielectric layer 26. The rough surface interface causes defects. Amorphous silicon ($\alpha$-Si), on the other hand, has very few grain boundaries, thus producing very smooth intersurfaces and therefore, lower resistivity.

The channel region 14 of memory cell 10 conducts current between source region 16 and drain region 18 in accordance with an electric field developed in channel region 14 by stacked gate structure 20. Because floating gate 24 is highly doped (e.g., approximately $1 \times 10^{20}$ atom/cm$^3$). The doping level of floating gate 24 is limited by charge retention. If the doping level is too high, dopant segregation to tunnel oxide 22 increases, causing tunnel oxide integrity problems such as impurity contamination and high defect density. Higher doping levels also produce higher surface roughness between floating gate 24 and tunnel oxide layer 22 and between floating gate 24 an interpoly dielectric layer 26. The rough surface causes high interface resistance and lower the oxide dielectric strength of interpoly dielectric layer 26, thereby decreases circuit performance, causes reliability problem and program/erase endurance cycling charge gain (loss) problem.

Floating gate 24 that is lightly doped or not doped can eliminate some of the above-described problems. However, lower doping levels degrade circuit performance because of poly I depletion of floating gate 24. Further, floating gate 24 and the select gate (not shown) are typically made from the same layer of material. Thus, lowering or eliminating the doping would undesirably lower the conductivity of the select gates.

Therefore, what is needed is a floating gate structure that has good charge retention as well as good interface properties.

SUMMARY OF THE INVENTION

The present invention provides a method of forming floating gate to improve tunnel oxide reliability for flash memory devices. In accordance with the present invention, a substrate having a source, a drain, and a channel region is provided. A tunnel oxide layer is formed over the substrate. A floating gate is formed over the tunnel oxide layer and over the channel region, the floating gate being multi-layered having a second layer sandwiched between a first layer and a third layer. The first layer of the floating gate is made of undoped or lightly doped amorphous silicon. Since the first layer is in direct contact with the tunnel oxide and not doped or lightly doped, impurity contamination of tunnel oxide and defect density at the floating gate-tunnel oxide interface is decreased, thereby improving tunnel oxide quality. The second layer of the floating gate is a conductive layer made of doped amorphous silicon. This conductive layer acts as the conductor of the select gate. The third layer is in direct contact with a dielectric layer and is made of undoped or lightly doped amorphous silicon. This undoped or lightly doped amorphous silicon improves smooth interface between the floating gate and the dielectric as well as decreases impurity segregation through the interface. Therefore, the multi-layered floating gate structure exhibits less impurity segregation to tunnel oxide and ONO stack films, improving tunnel oxide integrity and ONO charge retention (i.e., less leakage current).

The present invention is better understood upon consideration of the detailed description below and the accompanying drawings.

BRIEF DESCRIPTION OF THE DRAWINGS

Use of the same reference numbers in different figures indicates similar or like elements.

DETAILED DESCRIPTION

Figure 1:
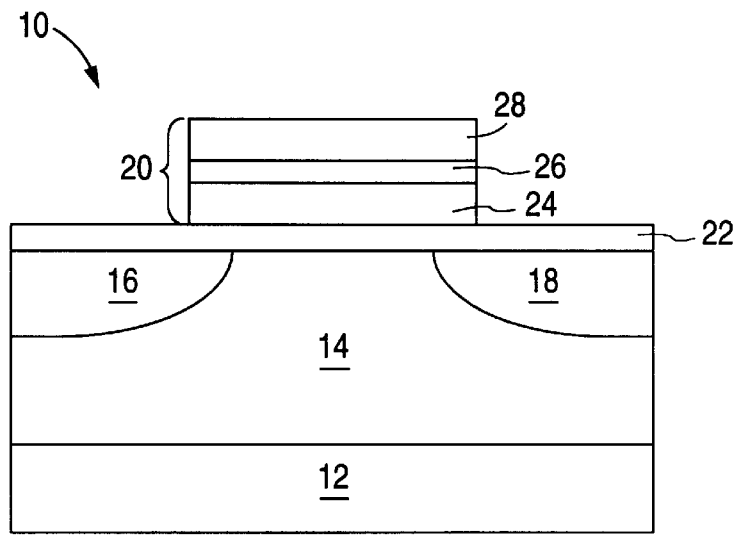
FIG. 1 shows a cross sectional view of a memory cell.
Figure 2:
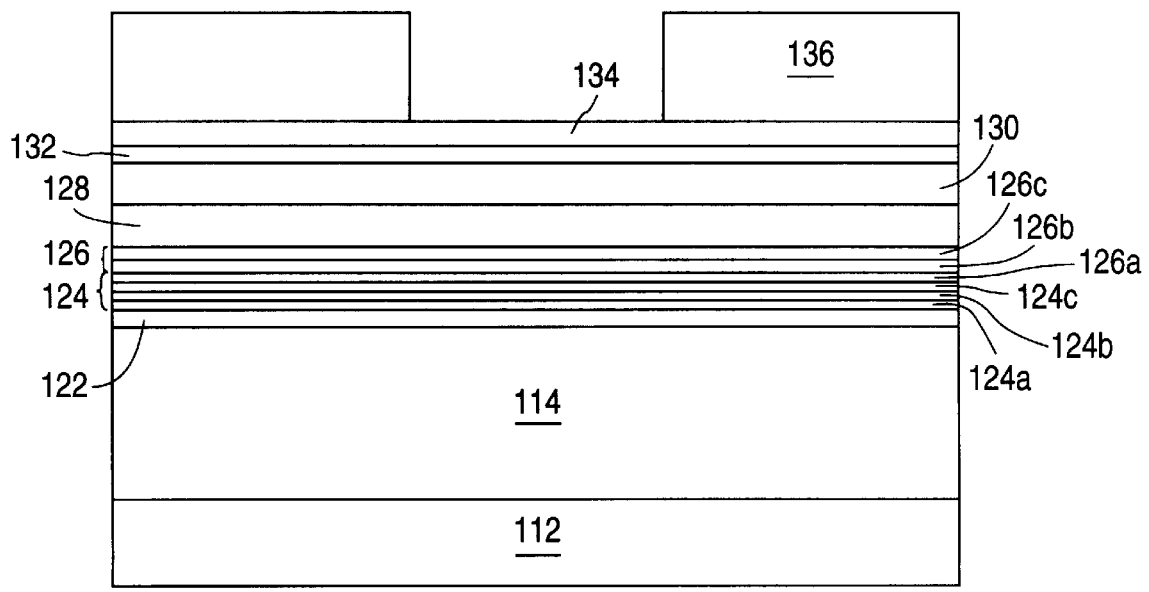
FIGS. 2–4 show process steps for forming a memory cell in accordance with the present invention.
Figure 3:
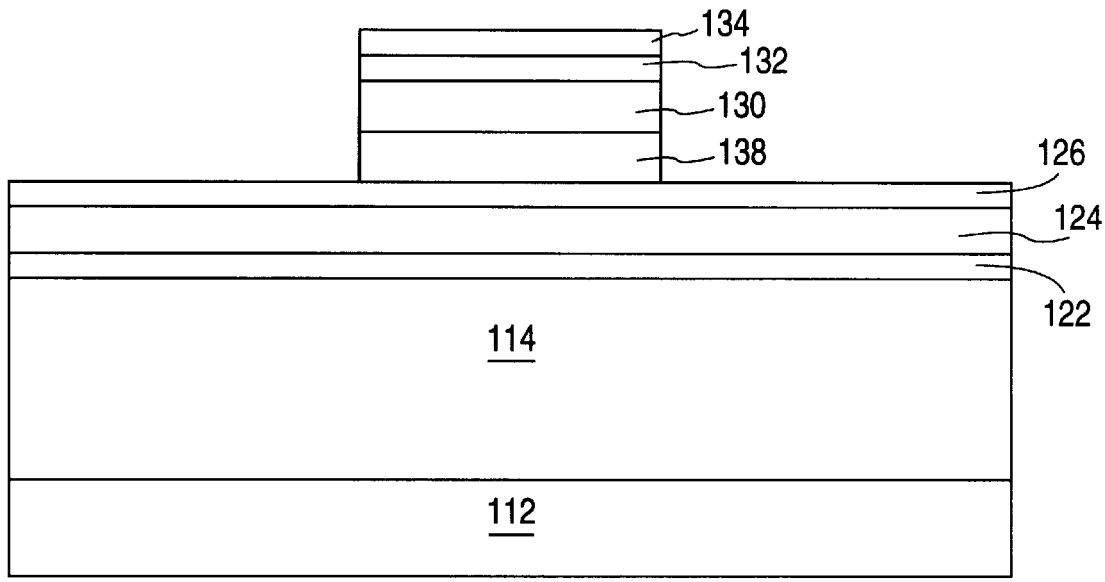
Figure 4:
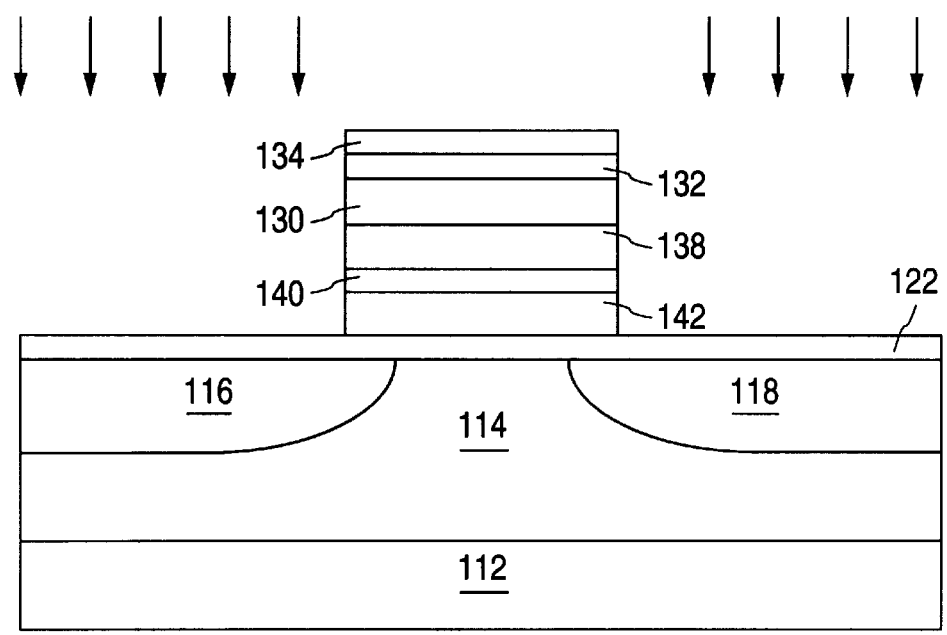

The present invention provides a method of forming a memory cell having a floating gate that has charge retention as well as improved tunnel oxide integrity. FIGS. 2 through 4 show the processing steps of forming a single memory cell for a NAND-type memory device in accordance with the present invention. However, it is to be understood that the present invention is equally applicable to NOR-type memory devices.

A plurality of flash memory cells can be formed on a semiconductor substrate, such as a silicon die, each with an N-type source region and N-type drain region formed within a P-well of the substrate with a P-type channel region interposed between the source and drain regions. Although fabrication of one flash memory cell is described below, it will be understood by those skilled in the art that the methods described herein are applicable to mass production methods wherein two or more cells are formed.

Referring to FIG. 2, an N-type semiconductor substrate 112 having a P-well region 114 is provided. Substrate 112 is typically made of silicon. A tunnel oxide layer 122 is formed over substrate 112 using a thermal growth process in a dry oxidation furnace. For example, tunnel oxide layer 122 can be formed via dry oxidation at a temperature of about 1050° C. under an atmosphere of oxygen ($O_2$) at about 1.33 liter (l), hydrochloride (HCl) at about 70 cc and argon (Ar) at about 12.6 liter. Alternatively, tunnel oxide layer 122 may be formed from silicon oxynitride (SiON). Tunnel oxide layer 122 has a thickness in the range of approximately 50 Å (angstroms) to approximately 150 Å, with the typical being, for example, approximately 87 Å or approximately 92 Å.

A first amorphous silicon layer 124 is formed over tunnel oxide layer 122. In accordance with the present invention, amorphous silicon layer 124 is multi-layered and has a thickness in the range of approximately 800 Å to approximately 1000 Å with the typical thickness being approximately 900 Å.

The first amorphous silicon layer 124a is an undoped or lightly doped amorphous silicon layer of a thickness that is approximately 10% to approximately 40% of the total thickness of amorphous silicon layer 124. First amorphous silicon layer 124a is deposited via low pressure chemical vapor deposition (LPCVD), for example, at a temperature in the range of approximately 450° to approximately 590° C. and a pressure in the range of approximately 300 mT to approximately 500 mT. In one embodiment, first amorphous silicon layer 124a is deposited by LPCVD at approximately 530° C. and approximately 400 mT.

In one embodiment, first amorphous silicon layer 124a is undoped. Since this first amorphous silicon layer is in direct contact with tunnel oxide layer 122 and is undoped, there is no impurities at the interface between amorphous silicon layer 124 and tunnel oxide layer 122. Thus, dopant segregation at the interface is eliminated, thereby improving tunnel oxide layer 122 reliability. Alternatively, first amorphous silicon layer 124a is lightly doped, for example, at approximately $5 \times 10^{15}$ to approximately $5 \times 10^{18}$ atom/cm$^3$. In one embodiment, the amorphous silicon is doped in situ (i.e., the amorphous silicon is doped during its formation), rather than doped by subsequent ion implantation. In situ doping and amorphous silicon deposition for a lightly-doped first amorphous silicon layer 124a are performed via LPCVD under a gas flow of silicon containing gas such as silane ($SiH_4$) in the range of approximately 1,500 sccm to approximately 2,500 sccm with a typical content of approximately 2,000 sccm and mixture of phosphorous containing gas in an inert gas in the range of approximately 10 sccm to approximately 30 sccm. Inert gases include nonreactive gases such as, but not limited to, nitrogen, helium, neon, argon, krypton and xenon. The typical amount by weight of phosphorous containing gas in the inert gas is in the range of approximately 0.9% to approximately 1.1%. In one embodiment, the phosphorous containing gas is phosphine ($PH_3$) and the inert gas is helium (He) with the amount by weight of phosphorous containing gas in the inert gas being approximately 1%. The process is performed at approximately 22 sccm.

At lower doping level, the interface between amorphous silicon layer 124 and tunnel oxide layer 122 is improved because when a positive gate voltage is applied, more depletion regions are formed at this interface, thereby reducing the electrical field, i.e., charge gain, of tunnel oxide layer 122. Low dopant level in floating gate also reduces dopant segregation at the interface, thereby improving the interface.

Next, a doped amorphous silicon layer 124b is deposited over the first undoped or lightly doped amorphous silicon layer 124a. The process for forming doped amorphous silicon layer 124b involves similar steps as forming the lightly doped amorphous silicon layer 124a described above, but using different dopant levels. For example, amorphous silicon is deposited via LPCVD at a temperature of approximately 530° C. and a pressure approximately 400 mT. The amorphous silicon is doped in situ via LPCVD under a gas flow of silicon containing gas such as silane ($SiH_4$) between approximately 1,500 sccm and approximately 2,500 sccm with a typical of approximately 2,000 sccm and mixture of phosphorous containing gas in an inert gas in the range of approximately 10 sccm and approximately 30 sccm with the typical at approximately 22 sccm. Inert gases include nonreactive gases including nitrogen, helium, neon, argon, krypton and xenon. In one embodiment, the phosphorous containing gas is phosphine ($PH_3$) and the inert gas is helium (He). In one embodiment, the amount by weight of phosphorous containing gas in the inert gas is in the range of approximately 0.9% to approximately 1.1% with the typical being approximately 1%.

The resultant dopant level of phosphorus within the resultant amorphous silicon layer 124b is relatively high, for example, approximately $5 \times 10^{18}$ atom/cm$^3$ to approximately $2 \times 10^{20}$ atom/cm$^3$. Because this doped amorphous silicon layer is not in direct contact with either a subsequently formed dielectric layer 126 or tunnel oxide layer 122, the doping level is not limited by charge retention. Therefore, this layer may be doped at a high level. Since doping lowers the resistivity of the amorphous silicon, higher dopant level improves conductivity. This doped amorphous silicon layer 124b, therefore, serves the conductor function for the select gate (not shown) which is made from the same layer of material (e.g., amorphous silicon layer 124) that forms floating gate 142 (FIG. 4). The thickness of doped amorphous silicon layer 124b is approximately 40% to approximately 80% of the total thickness of amorphous silicon layer 124.

It is noted that although impurities of this heavily doped amorphous silicon layer will diffuse into the first undoped or lightly doped amorphous silicon layer 124a below, the impurities do not diffuse through first undoped or lightly doped amorphous silicon layer 124a into tunnel oxide layer 122.

Finally, a second undoped or lightly doped amorphous silicon layer 124c is formed over doped amorphous silicon layer 124b. Second undoped or lightly doped amorphous silicon layer 124c is formed using similar process as that described above in forming first undoped or lightly doped amorphous silicon layer 124a. In one embodiment, amorphous silicon layer 124c has a dopant level of approximately $5 \times 10^{15}$ to approximately $5 \times 10^{18}$ atom/cm$^3$. Second undoped or lightly doped amorphous silicon layer 124c will be in direct contact with a subsequently formed dielectric layer 126. Since second amorphous silicon layer 124c is in direct contact with dielectric layer 126 and is undoped or lightly doped, dielectric layer 126 quality is improved and charge retention is improved due to reduced dielectric charge leakage.

Dielectric layer 126 is typically a multi-layered dielectric, as shown in FIG. 2. Dielectric layer 126 is often called an interpoly dielectric and is sandwiched between amorphous silicon layer 124 which forms the floating gate and a doped amorphous silicon layer 128 that forms the control gate for the memory cell. In one embodiment, dielectric layer 126 is made of an oxide-nitride-oxide (ONO) stack and is typically of a thickness in the range of approximately 120 Å to approximately 400 Å with the typical thickness being approximately 130 Å. Generally, dielectric layer 126 is formed by repetitive depositions of oxide, nitride and oxide to form a dielectric layer in which the nitride is sandwiched between a bottom oxide layer and a top oxide layer.

The bottom oxide layer 126a of dielectric layer 126 is deposited using chemical vapor deposition (CVD) techniques. For example, bottom oxide layer 126a is deposited at a temperature of approximately 750° C. under silane (SiH$_4$) at approximately 20 sccm, nitride (N$_2$O) at approximately 1.2 liter and a carrier gas at a pressure of approximately 600 mT via LPCVD oxide on the second undoped or lightly doped amorphous silicon layer 124c. The bottom oxide layer 126a has a thickness in the range of approximately 40 Å to approximately 60 Å, with the typical thickness being approximately 50 Å. A nitride layer 126b is next deposited using CVD techniques, for example, at a temperature of approximately 760° C. under ammonia (NH$_3$) at approximately 600 cc, dichlorosilane (SiH$_2$Cl$_2$) at approximately 100 cc and a pressure of approximately 330 mT. Nitride layer 126b has a thickness in the range of approximately 60 Å to approximately 100 Å with the typical thickness being approximately 80 Å. The top oxide layer 126c is formed in a similar manner as the first oxide layer 126a or in the alternative, by wet oxidation at approximately 950° C. for approximately 40 minutes using oxygen (O$_2$) at approximately 5 liters and hydrogen (H$_2$) at approximately 9 liters. Top oxide layer 126c has a thickness of approximately 40 Å.

A second amorphous silicon layer 128 of approximately 1200 Å is formed over dielectric layer 126. Second amorphous silicon layer 128 is doped. Specifically, a phosphorus doped amorphous silicon layer is deposited via CVD to form amorphous silicon layer 128 at approximate 530° C., 400 mT, silane (SiH$_4$) at approximately 2,000 sccm, and a mixture of approximately 1% by weight, phosphine (PH$_3$) in helium (He) at approximately 75 sccm. Alternatively, the second amorphous silicon layer 128 can be deposited by LPCVD followed by ion implantation of a dopant such as phosphorus. Doping lowers the resistivity of the amorphous silicon, rendering it conductive. Second amorphous silicon layer 128 will be used to form the control gate of the memory cell.

A tungsten-silicide (WSix) layer 130 of approximately 1500 Å thick is deposited via CVD to provide a lower resistance contact for improved flash memory cell performance. Specifically, tungsten silicide is deposited at a temperature of approximately 360° C. and a pressure of approximately 200 mT. The gas flow includes silane (SiH$_4$) and Argon (Ar) tungsten hexaflouride (WF$_6$). The gas flow contains approximately 500 sccm silane and approximately 50 sccm of Ar(WF$_6$).

Poly-cap layer 132 is deposited over tungsten silicide layer 130. Poly-cap layer 132 is approximately 500 Å thick, and is formed via, for example, LPCVD. The poly-cap layer 132 can be used to prevent potential peeling or cracking of the underlying tungsten silicide 130.

A capping layer 134, for example, of silicon oxynitride (SiON) is deposited over poly-cap layer 132. Capping layer 134 provides an anti-reflective coating at masking and also acts as a masking layer for subsequent etching. Capping layer 134 is approximately 1000 Å thick.

A mask 136 is formed over capping layer 134 using conventional photolithography technique to define the memory cell. The exposed silicon oxynitride cap 134, polysilicon cap 132, tungsten silicide layer 130 and doped amorphous silicon layer 128 are then etched. Next, mask 136 is stripped. This etch forms control gate 138 of the memory cell. Subsequent etching steps form interpoly dielectric layer 140 and floating gate 142, as shown in FIG. 3 and FIG. 4.

The formation of the source and drain regions 116 and 118, respectively, is by, for example, ion implantation using suitable and known methods. For example, the exposed substrate 100 is doped at $1.0 \times 10^{14}$ atom/cm$^3$ to form source and drain regions 116 and 118, respectively. For a NAND device, the dopant is, for example, phosphorous. During the formation of the source and drain regions 116 and 118, the stacked gate structure serves as a self-aligning mechanism. Ion implantation and annealing typically complete the formation of the source and drain regions. A flash memory cell with a double-diffused source region or a flash memory cells with a single-diffused region may be made in the above manner.

The above detailed description is provided to illustrate the specific embodiments of the present invention and is not intended to be limiting. Numerous variations and modifications within the scope of the present invention are possible. The present invention is set forth in the following claims.

What is claimed is:

1. A method for forming a memory cell, comprising:
    providing a substrate;
    forming a tunnel oxide layer over said substrate;
    forming a floating gate over said tunnel oxide layer, comprising:
        forming a first layer over said tunnel oxide layer, said first layer having a first impurity concentration;
        forming a second layer over said first layer, said second layer having a second impurity concentration which is greater than said first impurity concentration; and
        forming a third layer over said second layer, said third layer having a third impurity concentration which is less than said second impurity concentration;
    forming a dielectric layer over said floating gate; and
    forming a control gate over said dielectric layer.

2. The method of claim 1, wherein said floating gate comprises amorphous silicon.

3. The method of claim 1, wherein said first layer is undoped.

4. The method of claim 1, further comprising doping said first layer in the range of approximately $5 \times 10^{15}$ to approximately $5 \times 10^{17}$ atom/cm$^3$.

5. The method of claim 1, further comprising doping said second layer in the range of approximately $5\times10^{18}$ to approximately $2\times10^{20}$ atom/cm$^3$.

6. The method of claim 1, wherein said third layer is undoped.

7. The method of claim 1, further comprising doping said third layer in the range of approximately $5\times10^{15}$ to approximately $5\times10^{17}$ atom/cm$^3$.

8. The method of claim 1, wherein said dielectric layer comprises an oxide-nitride-oxide (ONO) stack.

9. The method of claim 1, further comprising:

forming a tungsten-silicide layer over said control gate;

forming a polysilicon cap over said tungsten-silicide layer;

forming a silicon oxynitride layer over said polysilicon cap; and doping an exposed portion of said substrate to form a drain region, a source region and a channel region.

10. A memory cell, comprising:

a substrate having a source region, a drain region and a channel region;

a tunnel oxide layer over said substrate;

a floating gate over said tunnel oxide layer and said channel region, comprising a second layer sandwiched between a first layer and a third layer, said first, second and third layers having first, second and third dopant concentrations, respectively, wherein said second dopant concentration is higher than either said first dopant concentration or said third dopant concentration;

a dielectric layer over said floating gate; and a control gate over said dielectric layer.

11. The memory cell of claim 10, wherein said memory cell is a NAND-type memory cell.

12. The memory cell of claim 10, wherein said memory cell is a NOR-type memory cell.

13. The memory cell of claim 10, wherein said floating gate comprises amorphous silicon.

14. The memory cell of claim 10, wherein said first layer comprises undoped amorphous silicon.

15. The memory cell of claim 10, wherein said first layer comprises lightly doped amorphous silicon in the range of approximately $5\times10^{15}$ to approximately $5\times10^{17}$ atom/cm$^3$.

16. The memory cell of claim 10, wherein said second layer comprises doped amorphous silicon.

17. The memory cell of claim 10, wherein said second layer is doped in the range of approximately $5\times10^{18}$ to approximately $2\times10^{20}$ atom/cm$^3$.

18. The memory cell of claim 10, wherein said third layer comprises undoped amorphous silicon.

19. The memory cell of claim 10, wherein said third layer comprises doped amorphous silicon in the range of approximately $5\times10^{15}$ to approximately $5\times10^{17}$ atom/cm$^3$.

20. The memory cell of claim 10, wherein said dielectric layer comprises an oxide-nitride-oxide (ONO) stack.

21. The memory cell of claim 10, further comprising:

a tungsten-silicide layer over said control gate;

a polysilicon cap over said tungsten-silicide layer; and a silicon oxynitride layer over said polysilicon cap.

* * * * *